(12) United States Patent
Katsube

(10) Patent No.: US 8,173,565 B2
(45) Date of Patent: May 8, 2012

(54) SINTERED BODY OF LOW TEMPERATURE COFIRED CERAMIC AND MULTILAYER CERAMIC SUBSTRATE

(75) Inventor: Tsuyoshi Katsube, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/205,656

(22) Filed: Aug. 9, 2011

(65) Prior Publication Data

US 2011/0300355 A1 Dec. 8, 2011

Related U.S. Application Data

(63) Continuation of application No. PCT/JP2010/051929, filed on Feb. 10, 2010.

(30) Foreign Application Priority Data

Feb. 16, 2009 (JP) ................................. 2009-032650

(51) Int. Cl.
*C04B 35/03* (2006.01)
*C04B 35/00* (2006.01)

(52) U.S. Cl. ........ 501/135; 501/123; 501/125; 501/153; 501/154

(58) Field of Classification Search .................. 501/123, 501/125, 127, 133–137, 139, 153, 154
See application file for complete search history.

(56) References Cited

U.S. PATENT DOCUMENTS 7,365,036 B2 * 4/2008 Miyazaki et al. ............... 501/10
2001/0022237 A1 9/2001 Suzuki et al.
2008/0315123 A1 * 12/2008 Komatsu et al. ........... 250/492.1
2010/0139957 A1 * 6/2010 Motoya et al. ................ 174/257

FOREIGN PATENT DOCUMENTS

| JP | 48-48999 A | 7/1973 |
| JP | 2002-020163 A | 1/2002 |
| JP | 2002-173362 A | 6/2002 |
| JP | 2003-221277 A | 8/2003 |
| JP | 3466561 B2 | 11/2003 |
| JP | 2003-347732 A | 12/2003 |
| JP | 2006-001755 A | 1/2006 |
| JP | 2008-044829 A | 2/2008 |
| JP | 2008-053525 A | 3/2008 |
| WO | 2009/025156 A1 | 2/2009 |

OTHER PUBLICATIONS

Official Communication issued in International Patent Application No. PCT/JP2010/051929, mailed on Apr. 20, 2010.

* cited by examiner

*Primary Examiner* — Jerry Lorengo
*Assistant Examiner* — Noah Wiese
(74) *Attorney, Agent, or Firm* — Keating & Bennett, LLP

(57) ABSTRACT

In a sintered body of low temperature cofired ceramic constituting ceramic layers of a multilayer ceramic substrate provided with external conductor films, which is obtained by sintering a non-glass low temperature cofired ceramic material, respective crystalline phases of quartz, alumina, and fresnoite are deposited. The ceramic layers are, because of being in the form of a sintered body of non-glass low temperature cofired ceramic, less likely to fluctuate in composition, and the multilayer ceramic substrate can be thus inexpensively and easily manufactured therefrom. In addition, the ceramic layers have the above-mentioned respective crystalline phases deposited therein, and thus have a high joint strength with the external conductor films, and moreover, the sintered body itself has a high fracture touhgness value.

6 Claims, 1 Drawing Sheet

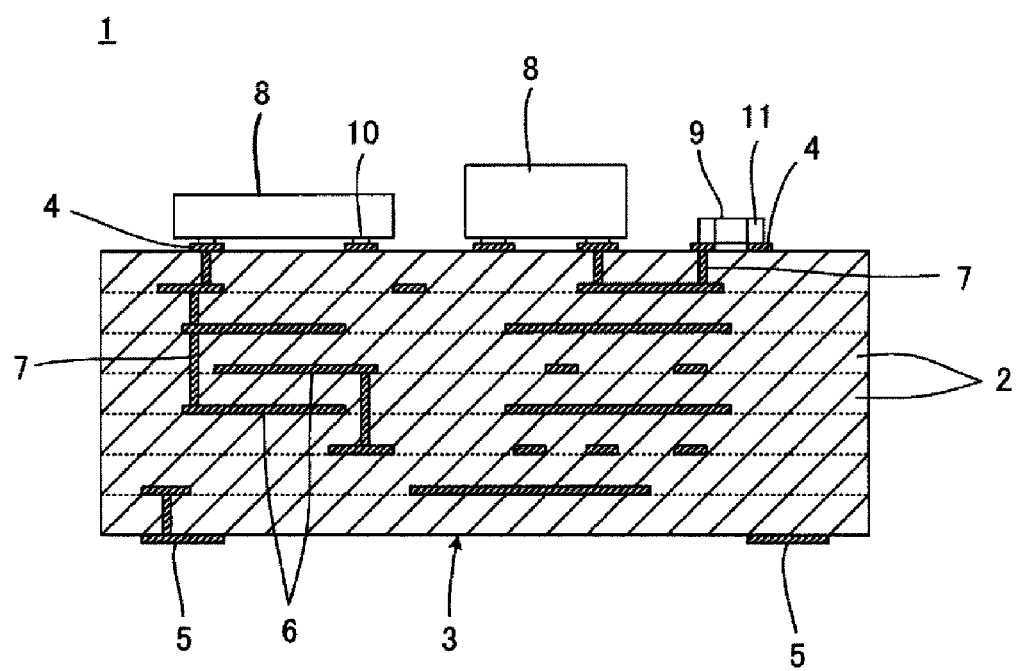

SINTERED BODY OF LOW TEMPERATURE COFIRED CERAMIC AND MULTILAYER CERAMIC SUBSTRATE

BACKGROUND OF THE INVENTION

1. Field of the Invention

The present invention relates to a sintered body of low temperature cofired ceramic obtained by firing a non-glass low temperature cofired ceramic material, and to a multilayer ceramic substrate including the sintered body of low temperature cofired ceramic.

2. Description of the Related Art

A sintered body of low temperature cofired ceramic (LTCC: Low Temperature Cofired Ceramic) is obtained by forming a low temperature cofired ceramic material into a predetermined shape and subjecting this material having the predetermined shape to sintering.

The low temperature cofired ceramic material can be subjected to cofiring with a low melting point metal material such as silver or copper with a relatively small specific resistance, thus, can form multilayer ceramic substrates which are excellent in terms of high frequency characteristics, and has been used as, for example, a substrate material for high frequency modules in information-communication terminals.

While a ceramic material such as $Al_2O_3$ mixed with a $B_2O_3$—$SiO_2$ based glass material, a so-called glass-ceramic composite system is typically used as the low temperature cofired ceramic material, this system requires the use of a relatively expensive glass material as a starting raw material, and in addition, contains boron which is likely to volatilize during firing. Therefore, substrates obtained are likely to fluctuate in composition, and thus, the manufacturing process of the substrates is complicated, such as having to use a special setter for controlling the volatilization amount of boron.

Accordingly, low temperature cofired ceramic materials have been proposed as described in, for example, Japanese Patent Application Laid-Open No. 2002-173362, Japanese Patent Application Laid-Open No. 2008-044829, and Japanese Patent Application Laid-Open No. 2008-053525. The low temperature cofired ceramic materials described in these documents will not encounter the problem as described, because the starting raw materials contain no glass, and moreover, because the low temperature cofired ceramic materials are non-glass low temperature cofired ceramic materials containing no boron.

However, sintered bodies of low temperature cofired ceramic obtained by sintering the low temperature cofired ceramic materials described in these documents may have an insufficient joint strength with a conductor film formed on the surface thereof in some case, and in addition, the sintered bodies themselves have a small fracture toughness value, and thus, may fail to provide desired strength properties in some cases.

SUMMARY OF THE INVENTION

In view of the actual circumstances described above, preferred embodiments of the present invention provide a sintered body of non-glass low temperature cofired ceramic which can be manufactured inexpensively and easily without using glass for a staring raw material, has a high joint strength with a conductor film, and has a high fracture toughness value.

In addition, preferred embodiments of the present invention provide a multilayer ceramic substrate with high reliability, which includes a plurality of ceramic layers made of the sintered body of low temperature cofired ceramic.

A sintered body of low temperature cofired ceramic according to a preferred embodiment of the present invention is obtained by sintering a non-glass low temperature cofired ceramic material, and includes respective crystalline phases of quartz, alumina, and fresnoite deposited therein.

Another preferred embodiment of the present invention provides a multilayer ceramic substrate including a laminate including a plurality of ceramic layers stacked on each other; and conductor patterns containing gold, silver, or copper as their main constituent, the conductor patterns provided on a surface layer of and an inner layer of the laminate. In the multilayer ceramic substrate according to a preferred embodiment of the present invention, the ceramic layers are preferably obtained by sintering a non-glass low temperature cofired ceramic material and are constituted by a sintered body of low temperature cofired ceramic in which respective crystalline phases of quartz, alumina, and fresnoite are deposited.

The sintered body of low temperature cofired ceramic according to a preferred embodiment of the present invention is obtained by sintering a non-glass low temperature cofired ceramic material, and thus, is less likely to fluctuate in composition and is inexpensive, and in addition, the manufacturing process of the sintered body is easy because the sintered body can be fired without the use of any special setter. Furthermore, the sintered body has the respective crystalline phases of quartz, alumina, and fresnoite deposited, and thus has a high joint strength with a conductor film formed on the surface thereof, and moreover, the sintered body itself has a high fracture toughness value, and thus has excellent strength properties.

Likewise, the multilayer ceramic substrate according to a preferred embodiment of the present invention is less likely to fluctuate in composition and is inexpensive because the ceramic layers constituting the multilayer ceramic substrate are obtained by sintering a non-glass low temperature cofired ceramic material, and in addition, can be manufactured easily because the multilayer ceramic substrate can be fired without the use of any special setter. Furthermore, the ceramic layers have the respective crystalline phases of quartz, alumina, and fresnoite deposited, and thus have a high joint strength with an external conductor film formed on the surface thereof, and moreover, the sintered body itself has a high fracture toughness value, and thus allows the multilayer ceramic substrate including the ceramic layers to have excellent strength properties with high reliability.

The above and other elements, features, steps, characteristics and advantages of the present invention will become more apparent from the following detailed description of the preferred embodiments with reference to the attached drawings.

BRIEF DESCRIPTION OF THE DRAWINGS

The FIGURE is a cross-sectional view schematically illustrating a multilayer ceramic substrate 1 configured with the use of a sintered body of low temperature cofired ceramic according to a preferred embodiment of the present invention.

DETAILED DESCRIPTION OF THE PREFERRED EMBODIMENTS

The sintered body of low temperature cofired ceramic according to a preferred embodiment of the present invention is obtained by sintering a non-glass low temperature cofired ceramic material, in which respective crystalline phases of quartz ($SiO_2$), alumina ($Al_2O_3$), and fresnoite ($Ba_2TiSi_2O_8$) are deposited. In this case, the "sintered body of low temperature cofired ceramic" refers to a low temperature cofired ceramic material subjected to sintering at a firing temperature of, for example, 1050° C. or less, which can be cofired with a low melting point metal material such as gold, silver, or copper with a small specific resistance. Furthermore, while the starting raw material contains substantially no glass constituent, the sintered body itself includes an amorphous section in addition to the respective crystalline phases described above. This is because when the non-glass low temperature cofired ceramic material is subjected to firing, the starting raw material thereof is partially turned into glass.

The sintered body of low temperature cofired ceramic according to a preferred embodiment of the present invention has the crystalline phases described above as main crystalline phases, and thus has a small specific dielectric constant $\in_r$ of 10 or less, allowing for the achievement of a sintered body of low temperature cofired ceramic which is suitable for ceramic layers constituting substrates for high frequencies. Moreover, the sintered body of low temperature cofired ceramic has a high joint strength with the external conductor film as described above, and thus has an improved electrode peel strength, thereby making problems less likely to be caused such as loss of on-board surface mounted components. Furthermore, the sintered body of low temperature cofired ceramic can form ceramic layers with a high fracture toughness value, thus allowing for the achievement of a multilayer ceramic substrate with excellent reliability.

In the sintered body of low temperature cofired ceramic according to a preferred embodiment of the present invention, at least one crystalline phase of sanbornite ($BaSi_2O_5$) and celsian ($BaAl_2Si_2O_8$) is further deposited preferably. This deposition of the crystalline phases of sanbornite and celsian results in the presence of various types of crystalline phases in large numbers, and as a result, the resultant heterogeneous crystal structure of the sintered body can, even when the sintered body is cracked, suppress the development of the crack. It is more preferable that the respective crystalline phases of sanbornite and celsian be both deposited.

In the sintered body of low temperature cofired ceramic according to a preferred embodiment of the present invention, the fresnoite crystalline phase is preferably included in a ratio of about 1 weight % to about 20 weight %, for example. This appropriate deposition amount of the fresnoite crystalline phase prevents the segregation of the crystalline phase to further improve the joint strength of the external conductor film, and thus further increase the electrode peel strength.

In addition, in the sintered body of low temperature cofired ceramic according to a preferred embodiment of the present invention, the fresnoite crystalline phase preferably has an average crystal grain size of about 5 μm or less, for example. More specifically, the presence of this fine crystalline phase in a predetermined ratio can increase crystal grain boundaries to suppress, even when the sintered body is cracked, the development of the crack.

In addition, the non-glass low temperature cofired ceramic material constituting the sintered body of low temperature cofired ceramic according to a preferred embodiment of the present invention preferably includes a main constituent ceramic material containing a Si oxide, a Ba oxide, and an Al oxide, and an accessory constituent ceramic material containing a Mn oxide and a Ti oxide, and contains substantially neither of a Cr oxide and a B oxide. The term "substantially" in this case means that a Cr oxide and a B oxide can be contained as impurities at less than about 0.1 weight %, for example. More specifically, even when a Cr oxide and a B oxide are mixed as impurities, the effects of a preferred embodiment of the present invention can be achieved as long as the Cr oxide and the B oxide are less than about 0.1 weight %.

More particularly, this low temperature cofired ceramic material preferably includes a main constituent ceramic material containing about 48 weight % to about 75 weight % of Si in terms of $SiO_2$, about 20 weight % to about 40 weight % of Ba in terms of BaO, and about 5 weight % to about 20 weight % of Al in terms of $Al_2O_3$, and an accessory constituent ceramic material containing about 2 parts to about 10 parts by weight of Mn in terms of MnO and about 0.1 parts to about 10 parts by weight of Ti in terms of $TiO_2$ with respect to 100 parts by weight of the main constituent ceramic material, and contains substantially neither of a Cr oxide and a B oxide.

This low temperature cofired ceramic material is a non-glass low temperature cofired ceramic material containing no boron because no glass is used as a starting raw material, and thus, a sintered body obtained is less likely to fluctuate in composition, and the firing process therefor can be managed easily. Moreover, the sintered body obtained itself has a high strength with a bending strength of about 230 MPa or more, and in the case of using this sintered body as a substrate, the substrate provides high reliability with a high peel strength and thus a high joint strength with the external conductor film. In addition, the promoted crystallization can improve the resistance to environments such as high temperatures and high humidity, and even improve the chemical resistance of the substrate such as an ability to prevent the elution of the substrate constituent into a plating solution. Furthermore, the promoted crystallization thus provides a multilayer ceramic substrate including a small amorphous section with a high Qf value.

In this case, the main constituent ceramic material containing about 48 weight % to about 75 weight % of Si in terms of $SiO_2$, about 20 weight % to about 40 weight % of Ba in terms of BaO, and about 5 weight % to about 20 weight % of Al in terms of $Al_2O_3$ is a basis constituent of the sintered body obtained, which makes a significant contribution to the achievement of a sintered body with a high insulation resistance, a small specific dielectric constant $\in_r$, and a small dielectric loss.

On the other hand, Mn (particularly MnO) as the accessory constituent ceramic material is likely to react with the $SiO_2$—BaO—$Al_2O_3$ based main constituent ceramic material to create a liquid phase constituent, and acts as a sintering aid by reducing the viscosity of the starting raw material during firing, but has much lower volatility as compared with $B_2O_3$ which likewise acts as a sintering aid. Therefore, Mn reduces fluctuation in firing, makes it easy to manage the firing process, and makes a contribution to an improvement in productivity.

In addition, Ti (particularly $TiO_2$) as the accessory constituent ceramic material can increase, although the detailed mechanism is not known, the reactivity between the ceramic layers made of the low temperature cofired ceramic material and the external conductor film made of a low melting point metal material such as copper, and the cofiring process can increase the joint strength between the sintered body and the conductor film, that is, the joint strength between the ceramic layers and the external conductor film. As a result, strong soldered joints are formed between active elements such as a semiconductor device and passive elements such as a chip capacitor, which are mounted on the multilayer ceramic substrate, and the multilayer ceramic substrate, thereby allowing the joints to be prevented from breaking due to shock such as fall of the element.

It is to be noted that this low temperature cofired ceramic material may further contain, in place of Ti mentioned above, or in addition to Ti, Fe (particularly $Fe_2O_3$) as an accessory constituent ceramic material. In this case, the content of Fe is preferably about 0.1 parts to about 10 parts by weight in total in conjunction with the Ti oxide with respect to 100 parts by weight of the main constituent ceramic material. This Fe can also increase the reactivity between the ceramic layers and the external conductor film, and the cofiring process can increase the joint strength between the sintered body and the conductor film, that is, the joint strength between the ceramic layers and the external conductor film.

In addition, this low temperature cofired ceramic material containing substantially no B oxide (particularly $B_2O_3$) can thus reduce the fluctuation in composition during firing of the material, and make it easy to manage the firing process, such as the elimination of the need for a special setter. In addition, the low temperature cofired ceramic material containing substantially no Cr oxide (particularly $Cr_2O_3$) can thus prevent the decrease in Qf value in a high-frequency band typified by a microwave band, and for example, a Qf value of 1000 or more can be achieved at 3 GHz.

This low temperature cofired ceramic material preferably contains no alkali metal oxide such as $Li_2O$ or $Na_2O$. This is because these alkali metal oxides are also likely to be volatile during firing as in the case of $B_2O_3$, which may cause fluctuation in the composition of a substrate obtained. Furthermore, when the low temperature cofired ceramic material contains none of these alkali metal oxides, the resistance to environments such as high temperatures and high humidity can be improved, and the chemical resistance such as an ability to prevent the elution into a plating solution can be even improved.

This low temperature cofired ceramic material preferably further contains, as an accessory constituent ceramic material, about 0.1 parts to about 5 parts by weight of Mg in terms of MgO with respect to 100 parts by weight of the main constituent ceramic material. This Mg (particularly MgO) contained in the low temperature cofired ceramic material promotes the crystallization of the low temperature cofired ceramic material during firing, thereby allowing for the reduction in the volume of a liquid phase section which causes a decrease in substrate strength, and allowing for a further improvement in the bending strength of a sintered body obtained.

In addition, this low temperature cofired ceramic material preferably further contains, as an accessory constituent ceramic material, about 0.1 parts to about 6 parts by weight of at least one selected from among Nb, Ce, Zr, and Zn respectively in terms of $Nb_2O_5$, $CeO_2$, $ZrO_2$, and ZnO with respect to 100 parts by weight of the main constituent ceramic material. The at least one selected from among Nb, Ce, Zr, and Zn (particularly at least one oxide selected from among $Nb_2O_5$, $CeO_2$, $ZrO_2$, and ZnO) contained in the low temperature cofired ceramic material can reduce the additive amount of Mn (particularly MnO) which is likely to remain as an amorphous constituent, thereby allowing for the reduction in the volume of a liquid phase section which causes a decrease in substrate strength, and allowing for a further improvement in the bending strength of a multilayer ceramic substrate obtained.

In addition, this low temperature cofired ceramic material may further contain, as an accessory constituent ceramic material, about 0.1 parts to about 5.0 parts by weight of Co and/or V respectively in terms of CoO and $V_2O_5$ with respect to 100 parts by weight of the main constituent ceramic material. These constituents can improve the bending strength of a multilayer ceramic substrate obtained, and also functions as a coloring agent.

The sintered body of low temperature cofired ceramic according to a preferred embodiment of the present invention can be manufactured by adding and mixing a ceramic powder of $MnCO_3$ as well as at least one ceramic powder of $TiO_2$ and $Fe_2O_3$ to and with respective ceramic powders of $SiO_2$, $BaCO_3$, and $Al_2O_3$ to obtain a low temperature cofired ceramic material, forming the low temperature cofired ceramic material into a predetermined shape, and further subjecting this compact to firing. Preferably, the sintered body of low temperature cofired ceramic is manufactured through a step of adding at least one ceramic powder of $TiO_2$ and $Fe_2O_3$ to respective ceramic powders of $SiO_2$, $BaCO_3$, and $Al_2O_3$ to obtain a mixture and subjecting the mixture to calcination, thereby preparing a calcined powder, and a step of adding, to the calcined powder, a ceramic powder of $MnCO_3$ subjected to no calcination.

Therefore, a ceramic green sheet including the low temperature cofired ceramic material described above is preferably manufactured through a step of adding at least one ceramic powder of $TiO_2$ and $Fe_2O_3$ to respective ceramic powders of $SiO_2$, $BaCO_3$, and $Al_2O_3$ to obtain a mixture and subjecting the mixture to calcination, thereby preparing a calcined powder, a step of adding, to the calcined powder, a ceramic powder of $MnCO_3$ subjected to no calcination, and a binder, thereby preparing a ceramic slurry, and a step of forming the ceramic slurry into a shape, thereby forming a ceramic green sheet.

As described above, for the manufacture of the low temperature cofired ceramic material or the ceramic green sheet, as long as a Mn constituent subjected to no calcination is added to a calcined powder obtained by calcination of a Si constituent, a Ba constituent, an Al constituent, and Ti/Fe constituent, the reaction of calcination synthesis is suppressed during the calcination, and the grain size for the calcined powder can be thus made smaller. Therefore, the step of grinding the calcined powder can be simplified, and the reduction in layer thickness can be easily advanced for ceramic green sheets prepared with the use of the calcined powder. In addition, the calcined powder can be prevented from undergoing a color change into a dark brown, and thus, in particular, in the case of printing a conductive paste containing copper as its main constituent, ceramic green sheets prepared with the use of this type of calcined powder can be improved in terms of image recognition.

Next, a multilayer ceramic substrate configured with the use of the sintered body of low temperature cofired ceramic according to a preferred embodiment of the present invention, and a method for manufacturing the multilayer ceramic substrate will be described with reference to a preferred embodiment shown in the FIGURE.

The FIGURE is a cross-sectional view schematically illustrating a multilayer ceramic substrate 1 including a sintered body of low temperature cofired ceramic according to a preferred embodiment of the present invention.

The multilayer ceramic substrate 1 includes a laminate 3 including a plurality of stacked ceramic layers 2. The ceramic layers 2 included in the laminate 3 are constituted by the sintered body of low temperature cofired ceramic according to a preferred embodiment of the present invention. In this laminate 3, various types of conductor patterns are provided in connection with specific ones of the ceramic layers 2.

The conductor patterns described above include several external conductor films 4 and 5 located on end surfaces in the stacking direction of the laminate 3, several internal conductor films 6 arranged along the specific interfaces between the ceramic layers 2, and via hole conductors 7 formed through specific ones of the ceramic layers 2, which function as interlayer connecting conductors.

The external conductor films 4 provided on the surface of the laminate 3 are used for connections to electronic components 8 and 9 to be mounted on the outer surface of the laminate 3. The FIGURE illustrates the electronic component 8 including bump electrodes 10, for example, like a semiconductor device, and the electronic component 9 including flat terminal electrodes 11, for example, like a chip capacitor. In addition, the external conductor films 5 located on the lower surface of the laminate 3 are used for connection to a mother board (not shown) on which this multilayer ceramic substrate 1 is to be mounted.

The laminate 3 included in this type of multilayer ceramic substrate 1 is obtained by firing a raw laminate including a plurality of stacked ceramic green layers to serve as the ceramic layers 2, and the internal conductor films 6 and via hole conductors 7 including a conductive paste, and in some cases, further including the external conductor films 4 and 5 including a conductive paste.

The stacked structure of the ceramic green layers in the raw laminate described above is provided typically by stacking multiple ceramic green sheets obtained by shape forming of a ceramic slurry, and the conductor patterns, in particular, the internal conductor patterns are provided on the ceramic green sheets before the stacking.

The ceramic slurry can be obtained by adding, to the low temperature cofired ceramic material described above, an organic binder such as polyvinyl butyral, a solvent such as toluene and isopropyl alcohol, a plasticizer such as di-n-butylphthalate, and in addition, if necessary, additives such as a dispersant for the formation of a slurry.

In the shape forming for obtaining the ceramic green sheets with the use of the ceramic slurry, for example, a doctor blade method is applied on a carrier film made of an organic resin such as polyethylene terephthalate to form the ceramic slurry into a sheet shape.

For providing the conductor patterns on the ceramic green sheets, with the use of a conductive paste containing, as a main constituent of its conductive constituent, a low melting point metal material such as gold, silver, or copper, through holes for the via hole conductors 7 are provided in the ceramic green sheets, and filled with the conductive paste, and conductive paste films for the internal conductor films 6 and conductive paste films for the external conductor films 4 and 5 are formed by, for example, a screen printing method. It is to be noted that the sintered body of low temperature cofired ceramic according to a preferred embodiment of the present invention is excellent in terms of cosinterability with a conductive paste containing, in particular, copper as its main constituent, among the low melting point metal materials of gold, silver, or copper.

These ceramic green sheets are stacked in a predetermined order, and subjected to pressure bonding with a pressure, for example, about 1000 kgf/cm$^2$ to about 1500 kgf/cm$^2$ in the stacking direction to provide a raw laminate. This raw laminate may be provided with, not shown, a cavity for housing other electronic components, and with a connection to fix thereto a cover covering the electronic components 8 and 9, etc.

The raw laminate is subjected to firing in a temperature range not less than the temperature at which the ceramic material contained in the ceramic green layers can be sintered, for example, about 850° C. or more, and not more than the melting point of the metal contained in the conductor patterns, for example, about 1050° C. or less in the case of copper. This firing makes the ceramic green layers sintered, and also makes the conductive pastes sintered, thereby forming a circuit pattern with the sintered conductor films.

Further, in particular, when the main constituent metal contained in the conductor patterns is copper, the firing is carried out in a non-oxidizing atmosphere such as a nitrogen atmosphere, for example, in such a way that the removal of the binder is completed at a temperature of about 900° C. or less, and the copper is not substantially oxidized at the completion of the firing by decreasing the oxygen partial pressure with decrease in temperature. Further, when the firing temperature is, for example, about 980° C. or more, it is difficult to use silver as the metal contained in the conductor patterns. However, it is possible to use, for example, an Ag—Pd based alloy containing about 20 weight % or more of palladium. In this case, the firing can be carried out in air. When the firing temperature is, for example, about 950° C. or less, silver can be used as the metal contained in the conductor patterns.

As described above, the laminate 3 shown in the FIGURE is obtained at the completion of the firing step.

Then, the electronic components 8 and 9 are mounted, thereby completing the multilayer ceramic substrate 1 shown in the FIGURE.

While the ceramic layers 2 in the multilayer ceramic substrate 1 described above include no glass as a starting constituent as described previously, the fired ceramic layers 2 include glass because the glass as an amorphous constituent is produced in the firing cycle. Therefore, the multilayer ceramic substrate 1 can be manufactured stably without the use of expensive glass.

It is to be noted while the sintered body of low temperature cofired ceramic according to a preferred embodiment of the present invention is preferably applied to multilayer ceramic substrates including a laminate which has a stacked structure as described above, the sintered body can be also applied to ceramic substrates which have a single layer structure simply including one ceramic layer. In addition, the sintered body of low temperature cofired ceramic according to a preferred embodiment of the present invention can also be applied to composite-type multilayer ceramic substrates including a lower dielectric constant ceramic layer made of the sintered body of low temperature cofired ceramic and including a higher dielectric constant ceramic layer made of another sintered body of low temperature cofired ceramic with a relatively high specific dielectric constant $\in_r$ (for example, with $\in_r$ of 15 or more).

Experimental Example

Next, an experimental example will be described which was carried out for confirming the effects and advantages of preferred embodiments of the present invention.

First, respective ceramic powders of $SiO_2$, $BaCO_3$, $Al_2O_3$, $MnCO_3$, $TiO_2$, and $Mg(OH)_2$ each with a grain size of 2.0 μm or less were prepared as starting raw materials. Next, these starting raw material powders were weighed so as to provide the composition ratios shown in Table 1 after firing, subjected to wet mixing and grinding, and then to drying, and the obtained mixtures were subjected to calcination at 750° C. to 1000° C. for 1 to 3 hours to obtain raw material powders. The $BaCO_3$ is turned into $BaO$ after the firing, the $MnCO_3$ is turned into $MnO$ after the firing, and the $Mg(OH)_2$ is turned into $MgO$ after the firing.

It is to be noted that in Table 1, the main constituent ceramic material of $SiO_2$, $BaO$, and $Al_2O_3$ is shown in terms of weight % (wt %), and the SiO$_2$, BaO, and Al$_2$O$_3$ account for 100 weight % in total. On the other hand, the accessory constituent ceramic material of MnO, TiO$_2$, and MgO is shown in terms of parts by weight as the ratios with respect to 100 parts by weight of the main constituent ceramic.

TABLE 1

| Sample No. | Composition of Main constituent ceramic material (wt %) | | | Composition of accessory constituent ceramic material (Parts by weight) | | |
|---|---|---|---|---|---|---|
| | SiO$_2$ | BaO | Al$_2$O$_3$ | MnO | TiO$_2$ | MgO |
| 1 | 57.0 | 31.0 | 12.0 | 6.5 | 0.5 | 1.5 |
| 2 | 57.0 | 31.0 | 12.0 | 6.0 | 1.0 | 1.5 |
| 3 | 57.0 | 25.0 | 18.0 | 8.0 | 5.0 | — |
| 4 | 63.0 | 22.0 | 15.0 | 10.0 | 10.0 | — |
| 5 | 57.0 | 31.0 | 12.0 | 4.0 | — | 2.0 |
| 6 | 57.0 | 31.0 | 12.0 | 7.0 | 12.0 | 1.0 |

Next, appropriate amounts of organic binder, dispersant, and plasticizer were added to the raw material powders according to each sample to prepare a ceramic slurry, and then, the ceramic slurry was subjected to mixing and grinding so as to provide an average grain size (D50) of 1.5 µm or less for the raw material powder in the slurry.

Next, the ceramic slurry was formed into a sheet shape in accordance with a doctor blade method, subjected to drying, and cut into an appropriate size to obtain ceramic green sheets of 50 µm in thickness.

Next, a conductive paste containing copper as its main constituent was printed by a screen printing method onto the predetermined ceramic green sheets to form conductor patterns to serve as external conductor films.

Next, after the obtained ceramic green sheets were cut into a predetermined size, the multiple ceramic green sheets were then stacked, and then subjected to thermocompression bonding under the conditions of temperature: 60° C. to 80° C. and pressure: 1000 kg/cm$^2$ to 1500 kg/cm$^2$ to obtain a raw laminate.

Next, the raw laminate was subjected to firing at a temperature of 900° C. to 1050° C. in a non-oxidizing atmosphere of nitrogen-hydrogen to obtain a plate-shaped ceramic sintered body sample made of the cosintered ceramic green sheets and conductor patters.

Next, the surface of the obtained sample was provided with indentation produced by a Vickers indenter under the condition of 500 gf×15 seconds, and the fracture toughness value K$_{IC}$ was calculated from the size of the indentation and the length of the crack. In addition, an L-shaped lead was soldered onto a cubic electrode of about 2 mm on a side on the surface of the obtained sample, and the joint strength (electrode peel strength) between the sample and the electrode was measured by a tension test in a perpendicular direction with respect to the surface of the sample. Furthermore, the samples were processed into a powdered form to identify the deposited crystals from X-ray diffraction spectra, and the ratio by weight (deposition amount) for the fresnoite crystalline phase was calculated from the diffraction peak intensity. In addition, the average grain size for the fresnoite crystalline phase was calculated under a scanning microscope and a transmission microscope. Furthermore, the specific dielectric constant ∈$_r$ at 3 GHz was measured by a perturbation method.

The results are shown in Table 2.

TABLE 2

| Sample No. | Fresnoite crystal | | Fracture | | |
|---|---|---|---|---|---|
| | Deposited crystalline phase *1 | Deposition amount [wt %] | Average grain size [µm] | Electrode peel strength [N/2 mm$^2$] | toughness value K$_{IC}$ [Pa·m$^{1/2}$] | Specific dielectric constant ∈$_r$ |
| 1 | Q, A, S, C, F | 1 | 2 | 34 | 1.33 | 6.8 |
| 2 | Q, A, S, C, F | 4 | 3 | 39 | 1.51 | 6.8 |
| 3 | Q, A, S, C, F | 9 | 3 | 43 | 1.55 | 6.5 |
| 4 | Q, A, S, C, F | 20 | 4 | 35 | 1.42 | 7.1 |
| 5 | Q, A, S, C | — | — | 13 | 1.18 | 6.9 |
| 6 | Q, A, C, F | 25 | 7 | 29 | 1.24 | 7.2 |

*1: Q: Quartz, A: Alumina, S: Sanbornite, C: Celsian, F: Fresnoite

As can be seen from Sample No. 1 to 4 and 6, the ceramic sintered bodies with the respective crystalline phases of quartz, alumina, and fresnoite deposited therein provided an electrode peel strength greater than 20 N/2 mm$^2$, a fracture toughness value K$_{IC}$ greater than 1.2 Pa·m$^{1/2}$, and a specific dielectric constant ∈$_r$ of 10 or less.

In addition, as can be seen from a comparison among Sample No. 1 to 4, with the increase in the TiO$_2$ amount, the relative deposition amount of the fresnoite crystalline phase in the sintered body was increased to result in a fracture toughness value K$_{IC}$ greater than 1.3 Pa·m$^{1/2}$ for all of the samples. More specifically, it has been determined that these samples are less likely to cause the development of cracks, and thus are excellent in terms of substrate strength. Furthermore, it has been determined as a result that cracks are less likely to be caused or developed at electrode joint interfaces, thereby resulting in increased shock resistance.

On the other hand, as in the case of Sample No. 5, in the case of no fresnoite crystalline phase produced, it has been determined that the fracture toughness value K$_{IC}$ is low, and the electrode peel strength is also low.

It is to be noted that when the ratio of TiO$_2$ was greater than 10 parts by weight with respect to 100 parts by weight of the main constituent ceramic material in the low temperature cofired ceramic material as in the case of Sample No. 6, the deposition of the fresnoite crystalline phase was increased, whereas the deposition amounts of the other crystalline phases such as sanbornite and celsian was relatively decreased, thereby resulting in a tendency to homogenize the crystal structure. In this case, such a stress distribution that prevents the development of cracks was decreased to result in a tendency to decrease the fracture toughness value K$_{IC}$. In addition, it is also considered that as a result of the increased average grain size for the fresnoite crystal phase, the crystal grain boundaries were decreased to decrease the fracture toughness value K$_{IC}$.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A sintered body of low temperature cofired ceramic obtained by sintering a non-glass low temperature cofired ceramic material, wherein respective crystalline phases of quartz, alumina, and fresnoite are deposited in the sintered body.

2. The sintered body of low temperature cofired ceramic according to claim 1, wherein at least one crystalline phase of sanbornite and celsian is further deposited in the sintered body.

3. The sintered body of low temperature cofired ceramic according to claim 1, wherein the fresnoite crystalline phase is included in a ratio of about 1 weight % to about 20 weight %.

4. The sintered body of low temperature cofired ceramic according to claim 1, wherein the fresnoite crystalline phase has an average crystal grain size of about 5 µm or less.

5. The sintered body of low temperature cofired ceramic according to claim 1, wherein the non-glass low temperature cofired ceramic material includes a main constituent ceramic material containing a Si oxide, a Ba oxide, and an Al oxide, and an accessory constituent ceramic material containing a Mn oxide and a Ti oxide, and contains substantially neither of a Cr oxide and a B oxide.

6. A multilayer ceramic substrate comprising:
a laminate including a plurality of ceramic layers stacked on each other; and
conductor patterns containing gold, silver, or copper as a main constituent, the conductor patterns provided on a surface layer of and an inner layer of the laminate; wherein
the ceramic layers are obtained by sintering a non-glass low temperature cofired ceramic material and are constituted by a sintered body of low temperature cofired ceramic in which respective crystalline phases of quartz, alumina, and fresnoite are deposited.

* * * * *